US006525425B1

(12) United States Patent
Woo et al.

(10) Patent No.: US 6,525,425 B1
(45) Date of Patent: Feb. 25, 2003

(54) COPPER INTERCONNECTS WITH IMPROVED ELECTROMIGRATION RESISTANCE AND LOW RESISTIVITY

(75) Inventors: Christy Mei-Chu Woo, Cupertino, CA (US); Pin-Chin Connie Wang, Menlo Park, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/593,231

(22) Filed: Jun. 14, 2000

(51) Int. Cl.[7] .................... H01L 23/48; H01L 23/52; H01L 29/40
(52) U.S. Cl. .............. 257/758; 257/762; 257/774; 257/742; 438/637; 438/654
(58) Field of Search .................. 257/758, 762, 257/774, 742; 438/637, 654

(56) References Cited

U.S. PATENT DOCUMENTS

| 5,766,379 A | * | 6/1998 | Lanford et al. | 148/537 |
|---|---|---|---|---|
| 5,814,557 A | | 9/1998 | Venkatraman et al. | 438/622 |
| 5,891,802 A | * | 4/1999 | Tao et al. | 438/656 |
| 6,010,960 A | * | 1/2000 | Nogami | 438/653 |
| 6,022,808 A | | 2/2000 | Nogami et al. | 438/694 |
| 6,130,156 A | * | 10/2000 | Havemann et al. | 438/637 |
| 6,136,707 A | | 10/2000 | Cohen | 438/687 |
| 6,140,241 A | | 10/2000 | Shue et al. | 438/692 |
| 6,168,704 B1 | | 1/2001 | Brown et al. | 205/118 |
| 6,171,960 B1 | * | 1/2001 | Lee | 438/687 |
| 6,207,222 B1 | * | 3/2001 | Chen et al. | 427/97 |
| 6,228,759 B1 | | 5/2001 | Wang et al. | 438/625 |

FOREIGN PATENT DOCUMENTS

| EP | 0 856 884 A2 | 8/1998 |
|---|---|---|
| EP | 0 877 421 A2 | 11/1998 |
| WO | WO 00/04573 | 1/2000 |

OTHER PUBLICATIONS

Cu(Sn) Alloys for Chip and Package Interconnects; IBM Technical Disclosure Bulletin; IBM Corporation; vol. 37, No. 10; Oct. 1994; p. 61.

* cited by examiner

*Primary Examiner*—Eddie Lee
*Assistant Examiner*—Chris C. Chu
(74) *Attorney, Agent, or Firm*—Harrity & Snyder, L.L.P.

(57) ABSTRACT

Copper interconnects are formed by depositing substantially pure copper into the lower portion of an interconnect opening. The upper portion of the interconnect opening is then filled with doped copper followed by a planarization process. The resulting copper interconnect exhibits reduced electromigration while maintaining low overall resistivity.

23 Claims, 5 Drawing Sheets

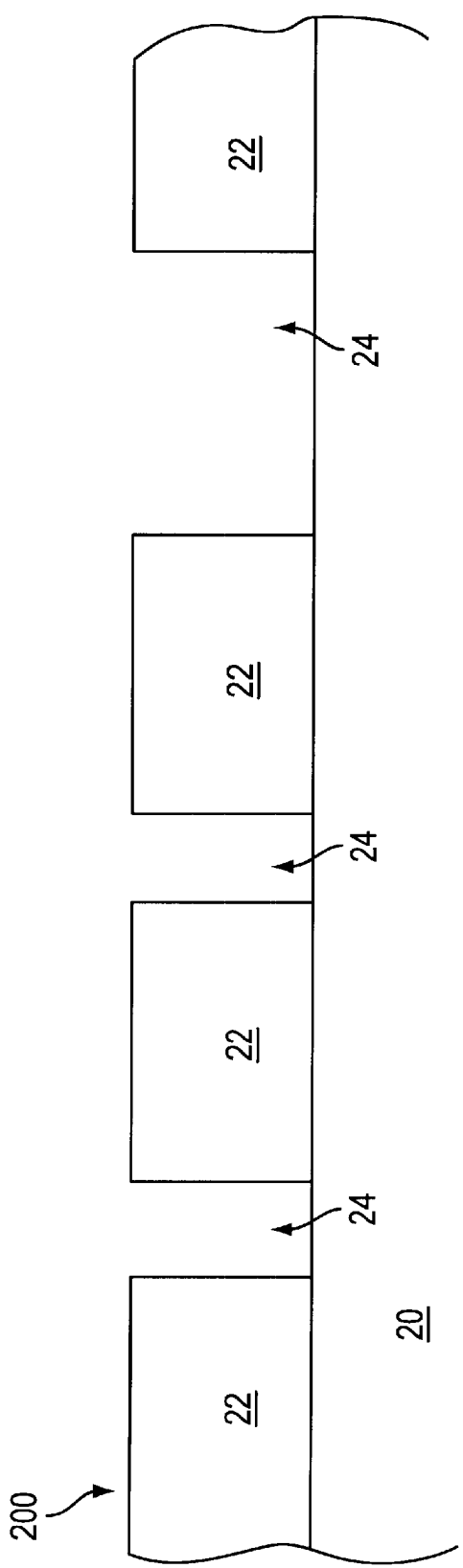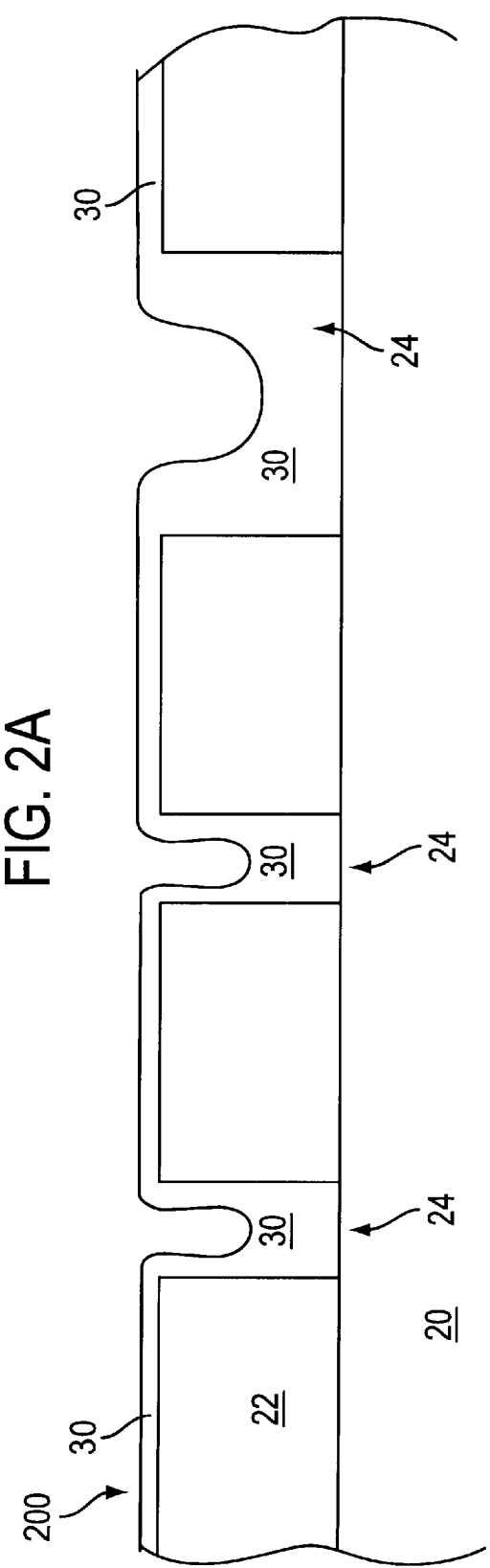

COPPER INTERCONNECTS WITH IMPROVED ELECTROMIGRATION RESISTANCE AND LOW RESISTIVITY

CROSS-REFERENCE TO RELATED APPLICATIONS

This application is related to the following commonly assigned, copending application Ser. No. 09/593,669 filed Jun. 14, 2000, entitled: METHOD OF MANUFACTURING A SEMICONDUCTOR DEVICE HAVING COPPER INTERCONNECTS.

TECHNICAL FIELD

The present invention relates to a semiconductor device and a method of manufacturing a semiconductor device having copper interconnects. The present invention has particular applicability to high density semiconductor devices with submicron design features.

BACKGROUND ART

The escalating requirements for high density and performance associated with ultra large scale integration semiconductor devices require design features of 0.25 microns and under, increased transistor and circuit speeds, high reliability and increased manufacturing throughput. The reduction of design features to 0.25 microns and under challenges the limitations of conventional methodology.

Conventional semiconductor devices typically comprise a semiconductor substrate, normally made of monocrystalline silicon, and multiple dielectric and conductive layers formed thereon. In a conventional semiconductor device 100 illustrated in FIG. 1, substrate 1 is provided with field oxide 2 for isolating an active region including source/drain regions 3, and a gate electrode 4, typically of doped polysilicon, above the semiconductor substrate with gate oxide 5 therebetween. Interlayer dielectric layer 6, typically silicon dioxide, is then deposited thereover and openings formed using conventional photolithographic and etching techniques. The openings are filled with conductive material to establish electrical contact between subsequently deposited conductive layer 8 and source/drain regions 3 through contacts 7, and to transistor gate electrode 49. Dielectric layer 9, typically silicon dioxide, is deposited on conductive layer 8, and another conductive layer 10, typically aluminum or an aluminum-base alloy, is formed on dielectric layer 9 and electrically connected to conductive layer 8 through vias 11.

With continued reference to FIG. 1, conductive layer 10 is the uppermost conductive layer and, hence, constitutes the wire bonding layer. Dielectric layer 12, also typically silicon dioxide, is deposited, and a protective dielectric scratch resistant topside layer 13 is deposited thereon. Protective dielectric layer 13 typically includes a nitride layer, such as silicon nitride ($Si_3N_4$). Alternatively, protective dielectric layer 13 may include a dual topcoat comprising a nitride layer on an oxide layer. The protective dielectric layer 13 provides scratch protection to the semiconductor device 100 and protection against moisture and impurity contamination during subsequent processing. After deposition of protective dielectric layer 13, conventional photolithographic etching techniques are employed to form an opening to expose wire bonding layer 10 for external connection via bonding pad 14 and electrically conductive wires 15 or an external connection electrode (not shown).

Although only two conductive layers 8 and 10 are depicted in FIG. 1 for illustrative convenience, conventional semiconductor devices may include more than two conductive layers, e.g., five conductive metal layers, depending on design requirements. Also in the interest of illustrative convenience, FIG. 1 does not illustrate any particular type of plug or barrier layer technology. However, such technology is conventional and, therefore, the details of such features are not set forth herein.

As device features continue to shrink in size, the interconnect structures, such as contacts 7 and vias 11 enable the semiconductor device 100 to offer more packing density, higher speeds and more flexibility in circuit design. Various metals, such as aluminum and aluminum-base alloys, have typically been used to form the electrical interconnects. More recently, copper and copper-base alloys have also been used to fill the openings to form the electrical interconnects. In such cases, the copper is typically deposited via a single electroplating process. That is, a single plating solution employing one type of plating chemistry is supplied to an electroplating chamber where the electroplating proceeds to fill the openings that form the interconnects. One problem with copper interconnects is that copper has low electromigration resistance and readily diffuses through silicon dioxide, the typical dielectric interlayer used in the manufacture of semiconductor devices.

In some prior processes, a dopant has been added to the copper to enhance the low electromigration resistance of copper. The dopant element forms intermetallic compounds with the copper and increases the electromigration resistance of the copper. In processes that employ copper alloys, however, the copper alloy is typically deposited throughout the entire opening that will form the interconnect or deposited and annealed to diffuse the dopant element throughout the entire interconnect structure. This use of copper alloys may help solve electromigration problems, but including the dopant throughout the entire interconnect increases the resistivity of the interconnect. This increased resistivity leads to slower processing associated with the semiconductor device.

DISCLOSURE OF THE INVENTION

There exists a need for a semiconductor device and a method for manufacturing a semiconductor device that improves electromigration problems associated with copper interconnects while maintaining low resistivity of the interconnect.

These and other needs are met by the present invention, where substantially pure copper is introduced into the lower portion of an interconnect opening followed by the introduction of doped copper at the top portion of the opening. The copper interconnect is then planarized, resulting in a copper interconnect having reduced electromigration and low overall resistivity.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a method of forming an interconnect in a semiconductor device. The method includes forming an opening in a dielectric layer and depositing substantially pure copper to fill a portion of the opening. The method also includes depositing doped copper over the substantially pure copper to fill the opening and planarizing the semiconductor device so that the filled opening is substantially coplanar with an upper surface of the dielectric layer.

According to another aspect of the invention, a semiconductor device is provided. The semiconductor device comprises a semiconductor substrate and a plurality of levels of dielectric layers and conductive layers formed on the semiconductor substrate. The semiconductor device also includes an interconnect formed in at least one of the dielectric layers. The interconnect electrically connects at least two of the conductive layers or one of the conductive layers and an active region in the semiconductor substrate. The interconnect includes a lower portion comprising substantially pure copper and an upper portion comprising doped copper.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation represent like elements throughout.

FIG. 2A schematically illustrates the formation of interconnect openings in a dielectric layer in accordance with an embodiment of the present invention.

FIG. 2B schematically illustrates the partial filling of the interconnect openings in FIG. 2A in accordance with an embodiment of the present invention.

BEST MODE FOR CARRYING OUT THE INVENTION

Figure 1:
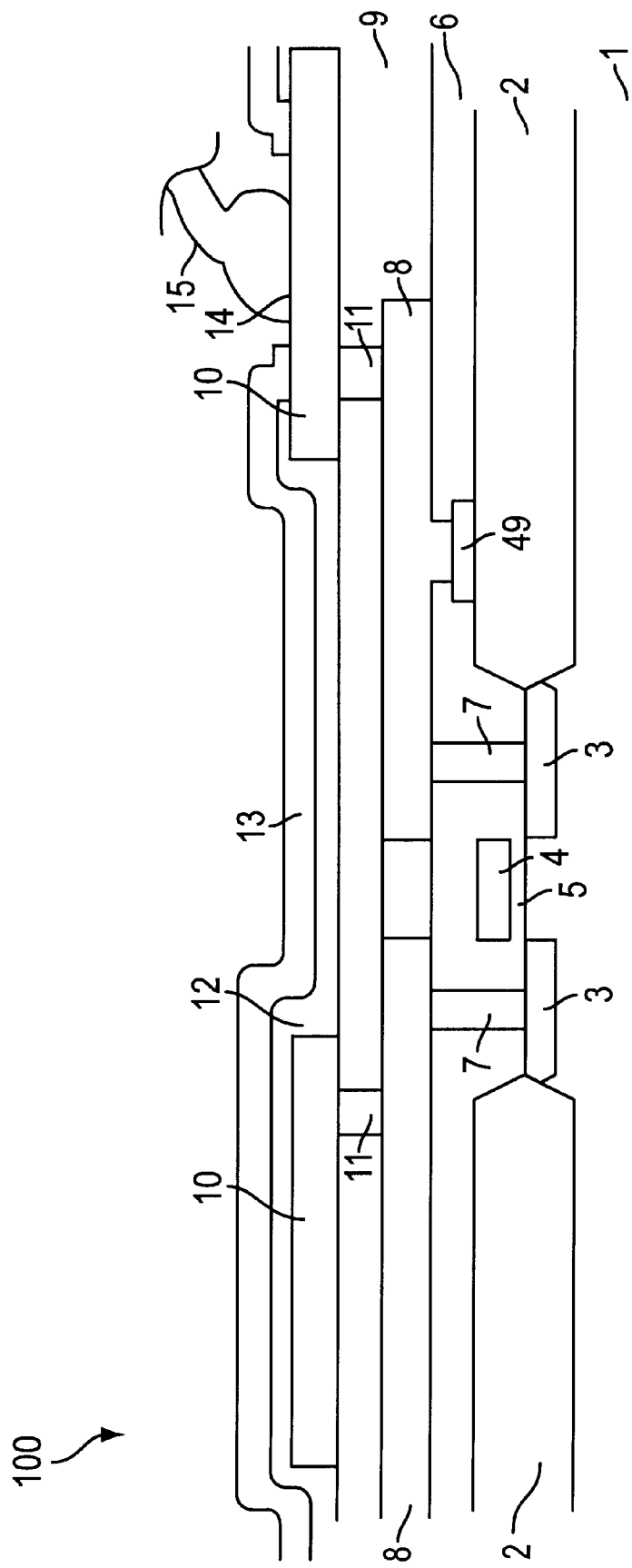
FIG. 1 schematically illustrates the cross-section of a conventional semiconductor device.

The present invention addresses and solves the problems of electromigration associated with copper interconnects while maintaining low overall resistivity of the interconnects.

FIG. 2A illustrates the cross-section of a semiconductor device 200 formed in accordance with an embodiment of the present invention. Referring to FIG. 2A, a dielectric layer 22, such as silicon dioxide or another material having a low dielectric constant (K), is formed above semiconductor substrate 20, typically comprising monocrystalline silicon. The dielectric layer 22 may also be formed of several films. For example, the dielectric layer 22 may be a composite including a low K material, a nitride layer formed thereon to serve as an anti-reflective coating (ARC) for subsequent lithographic and etching steps and a TEOS or nitride capping layer to protect the low K material. The dielectric layer 22 is shown directly above the substrate 20. It should be understood, however, that dielectric layer 22 may be an interlayer dielectric layer formed a number of layers above the surface of semiconductor substrate 20. For example, dielectric layer 22 may be an interlayer dielectric formed above a number of conductive and other dielectric layers (not shown) in semiconductor device 200.

Openings 24 are formed in dielectric layer 22 using conventional photolithographic and etching techniques. These openings 24 may represent holes for forming contacts or vias or trenches for forming interconnect lines. In FIG. 2A, three openings 24 are shown for simplicity and to illustrate various sized openings having different aspect ratios. The present invention, however, may be used to form any number of interconnects having any particular feature sizes and aspect ratios, based on the particular circuit requirements.

As discussed previously, conventional practices for forming interconnects use aluminum, aluminum-base alloys, copper or copper-base alloys. The present invention departs from conventional practices by depositing copper and a copper-base alloy in two plating processes to form the interconnect structure. FIG. 2B illustrates an exemplary embodiment of the present invention in which the first plating deposits essentially pure copper into the openings 24 using a non-conformal electroplating chemistry.

For example, the first plating process may use a plating solution that includes additives that enhance bottom filling of openings 24. Any conventional additive chemistry that is designed to enhance bottom filling, such as Nanoplate 2001 or Ultrafill 2001, both manufactured by Shipley Company of Marlborough, Mass., may be mixed with the plating solution used in the first plating process. Other plating chemistries designed to enhance the filling of the bottom portion of openings may also be used.

The bottom-enhanced filling chemistry is prepared in a conventional plating solution tank and supplied to a conventional electroplating chamber to begin the first plating process. Power is supplied to the electroplating chamber where the semiconductor device 200 acts as one of the two electrodes. The electroplating proceeds to deposit the essentially pure copper into openings 24. The electroplating is monitored so that a predetermined amount of copper is deposited into the openings 24. According to an exemplary embodiment of the present invention, a layer of essentially pure copper 30 is deposited on semiconductor device 200 until the openings are about 40% to about 90% filled. For example, FIG. 2B shows the openings 24 being about 70% filled. The particular percentage that the essentially pure copper 30 fills the openings 24 may be optimized based on the particular circuit requirements, as described in more detail below. After the predetermined amount of pure copper 30 has been deposited, the first plating process is terminated.

The present invention further departs from methodology that deposits doped copper over pure copper by using a second plating process to deposit a copper alloy. According to an exemplary embodiment of the present invention, a second plating solution employing a conformal filling chemistry is prepared in a plating solution tank to fill the remaining portion of the openings 24. The second plating solution also contains a dopant to form a copper alloy in the unfilled portions of the openings 24. The dopant element used to form the copper alloy may include tin, zirconium, strontium, palladium, magnesium, chromium or tantalum. Alternatively, any other dopant element that is known to increase the electromigration resistance of copper may be used. According to an exemplary embodiment, the plating solution is designed so that the percentage weight of the dopant element in the copper alloy ranges from about 0.3% to about 12.0%, based on the particular dopant element and the particular circuit requirements, as described in more detail below. Other percentages of the dopant element may be used in alternate embodiments of the present invention.

Figure 3:
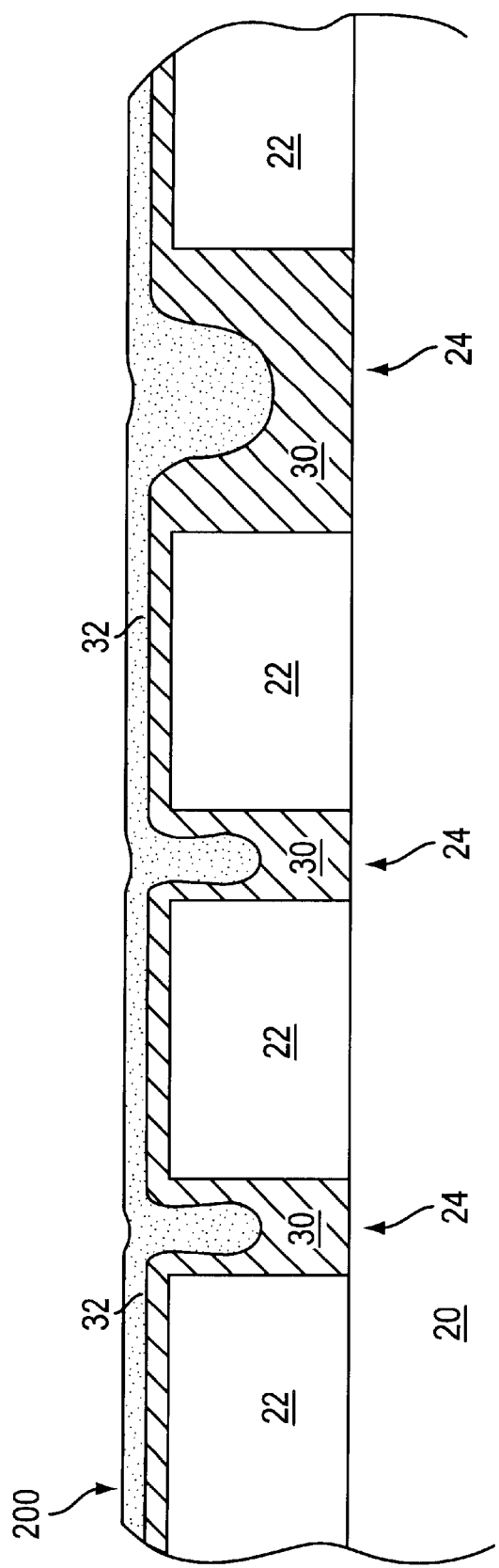
FIG. 3 illustrates filling the remainder of the interconnect openings in FIG. 2B, in accordance with an embodiment of the present invention.

The second plating solution is then supplied to the electroplating chamber to deposit the doped copper into the unfilled portions of the openings 24. According to an exemplary embodiment, the second plating process may be an electroless plating process. In this case, no electrical potential needs to be applied to the semiconductor device 200 while the plating process occurs. The electroless plating process relies on the autocatalytic deposition of the doped copper by the interaction of the agents in the plating solution. Alternatively, the second plating process may be an electroplating process. In either case, the second plating process deposits a layer of doped copper 32 on the semiconductor device 200 until the openings 24 are completely filled, as illustrated in FIG. 3. The layer of doped copper 32 also forms over the dielectric layer 22.

According to an exemplary embodiment of the present invention, the same plating chamber may be used for both platings, i.e., the copper plating and the copper alloy plating. In this scenario, the plating solution from the first plating is drained or returned to a holding tank and the second plating solution is supplied to the plating chamber. The supply of the two plating solutions may slightly overlap to preserve continuity and keep the surface of semiconductor device 200 from drying or starving for plating solution. Alternatively, a separate plating chamber may be used for the second plating process. In this scenario, the semiconductor device 200 is transported from the first plating chamber to a second plating chamber. Using separate plating chambers enables the first plating chamber to reuse existing plating solution used in the first electroplating process and also enables the second plating chamber to reuse plating solution used in the second plating process.

After the doped copper layer 32 has been deposited, the semiconductor device 200 is subjected to a chemical mechanical polishing (CMP) process. The CMP removes excess copper alloy 32 over the dielectric layer 22 and the filled openings 24 and planarizes the copper deposited in openings 24 with the upper surface of the dielectric layer 22.

Figure 4:
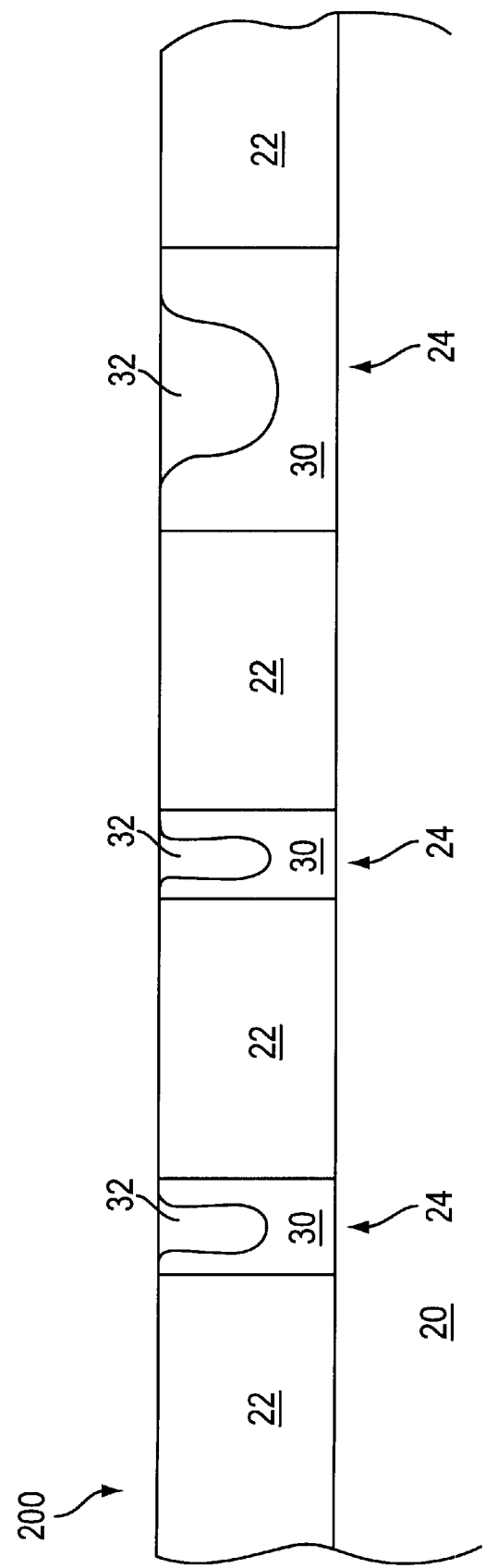
FIG. 4 illustrates the cross-section of the semiconductor device of FIG. 3 after planarization, in accordance with an embodiment of the present invention.

FIG. 4 illustrates the results of the CMP of semiconductor device 200. After CMP, the pure copper 30 remains in the bottom portion of the openings 24 and the copper alloy 32 remains in the upper portion of the openings 24. Additionally, the upper surface of the filled interconnect openings 24 are substantially coplanar with the upper surface of the dielectric layer 22. In this manner, subsequent processing steps may be performed over a substantially planar and smooth surface.

The resulting interconnect structures illustrated in FIG. 4 advantageously include the copper alloy in the areas requiring reduced electromigration, such as the upper surface of the interconnects. Additionally, the essentially pure copper is located throughout the remainder of the interconnect structure, resulting in low overall resistivity and higher speed interconnects. The particular percentage of the interconnect filled with copper versus the copper alloy may be optimized to provide increase electromigration benefits and maintain low overall resistivity. For example, in situations where operating speed is more important than increased electromigration resistance, the percentage of the interconnects that include the copper alloy may be reduced.

Additionally, in such situations, the percentage of the dopant element in the copper alloy may also be reduced to further decrease the overall resistivity. In this manner, the preferential deposition of copper and a copper alloy may be optimized to provide improved electromigration while maintaining low overall resistivity.

It should be understood that FIG. 4 does not illustrate any diffusion barrier layer that may be deposited in openings 24 prior to deposition of the copper layer 30. Such diffusion barrier layers are well known and further impede the electromigration of copper into various dielectric layers. It should also be noted that FIG. 4 does not illustrate a copper alloy seed layer that may be deposited on a diffusion barrier layer to enhance the adhesion of the undoped copper layer 30 during electroplating.

According to an exemplary embodiment of the present invention, a copper alloy seed layer may be deposited along the bottom and sidewall portions of the interconnect openings 24 to carry electrical current for electroplating. In depositing a relatively thin seed layer in the interconnect openings, the techniques disclosed in co-pending U.S. patent application Ser. No. 09/561,622, now U.S. Pat. No. 6,228,759, entitled: "Method of Forming an Alloy Precipitate to Surround Interconnect to Minimize Electromigration," may be used.

Figure 5:
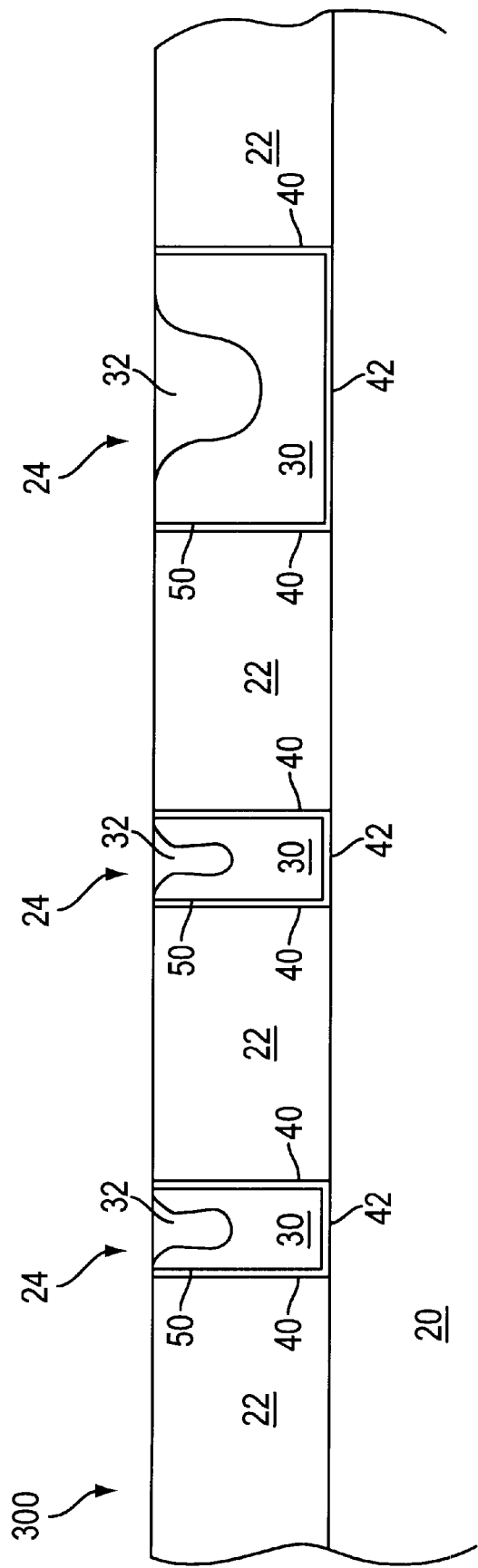
FIG. 5 illustrates the cross-section of an interconnect formed in accordance with an embodiment of the present invention.

For example, FIG. 5 illustrates a copper alloy seed layer 50 conformally deposited along the sidewalls 40 and bottom 42 of the respective interconnect openings 24 in semiconductor device 300. The copper alloy seed layer 50 may be deposited using any conventional process, such as chemical vapor deposition (CVD), ionized metal plasma (IMP) deposition, physical vapor deposition (PVD) or other known processes to conformally deposit a relatively thin layer in the interconnect openings 24. The thickness of the copper alloy seed layer 50 may range from about 200 Å to about 1000 Å, depending on the particular circuit requirements.

The dopant element in the copper alloy seed layer 50 may include magnesium, aluminum, zinc, zirconium, tin, nickel, palladium, silver or gold. Alternatively, other dopant elements may be used in copper alloy seed layer 50. The percentage by weight of the dopant element in the copper alloy seed layer 50 may be optimized based on the particular device requirements. For example, the percentage by weight of the dopant element in copper alloy seed layer 50 may range from about 0.3% to about 12%, based on the particular dopant and the particular circuit requirements.

After the copper alloy layer 50 is deposited, the first and second plating processes described with regard to FIGS. 2B and 3 are performed to deposit the essentially pure copper layer 30 and the doped copper layer 32. A CMP follows to planarize the semiconductor device 300, resulting in the semiconductor device 300 illustrated in FIG. 5. Advantageously, the doped copper seed layer 50 essentially encapsulates the pure copper 30, resulting in improved electromigration resistance throughout the entire interconnect structure.

Thus, in accordance with the present invention, an interconnect is formed using essentially pure copper and doped copper. Advantageously, the resulting interconnect structure exhibits improved electromigration resistance in areas more susceptible to electromigration while maintaining low overall resistivity. A copper alloy seed layer 50 formed along the bottom and sidewalls of the interconnect opening further improves the electromigration resistance of the interconnect, thereby further improving the reliability of the semiconductor device. The present invention is also cost effective and can be easily integrated into conventional processing.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of chemical vapor deposition (CVD) processes, including low pressure chemical vapor deposition (LPCVD) and enhanced chemical vapor deposition (ECVD) can be employed.

The present invention is applicable in the manufacturing of semiconductor devices and particularly in semiconductor devices with design features of 0.25 microns and below, resulting in increased transistor and circuit speeds and improved reliability. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

For example, the present invention has been described with the example of single level interconnects formed by created openings in a dielectric layer and filling the openings. The present invention is also applicable to other situations where interconnects are formed, such as dual damascene techniques which form a conductive via that contacts an upper trench section. In this scenario, the pure copper may be deposited in the conductive via and a portion of the conductive trench. The upper portion of the conductive trench may then be filled with doped copper.

What is claimed is:

1. A semiconductor device, comprising:
   a semiconductor substrate;
   a plurality of levels of dielectric layers and conductive layers formed on the semiconductor substrate; and
   an interconnect formed in at least one of the dielectric layers, the interconnect electrically connecting at least two of the conductive layers or one of the conductive layers and an active region in the semiconductor substrate, the interconnect comprising:
   a layer of doped copper formed along the bottom and sidewalls of the interconnect, the layer of doped copper including 7% to about 12% by weight of a dopant element,
   a lower portion comprising pure copper, wherein the layer of doped copper encapsulates the pure copper in the lower portion, and
   an upper portion comprising doped copper formed directly on the pure copper lower portion, the upper portion including 7% to about 12% by weight of a dopant element.

2. The semiconductor device of claim 1, wherein the interconnect represents at least one of a contact, a via and an interconnect line.

3. The semiconductor device of claim 1, wherein the lower portion comprises about 40% to about 90% of the interconnect.

4. The semiconductor device of claim 1, wherein the dopant element comprises at least one of tin, zirconium, strontium, palladium, magnesium, chromium, and tantalum.

5. The semiconductor device of claim 1, wherein the doped copper covers a substantial portion of an upper surface of the interconnect.

6. The semiconductor device of claim 1, wherein the layer of doped copper formed along the bottom and sidewalls includes at least 8% by weight of a dopant element.

7. The semiconductor device of claim 1, wherein the upper portions includes at least 8% by weight of a dopant element.

8. A semiconductor device, comprising:
   a semiconductor substrate;
   a plurality of levels of dielectric layers and conductive layers formed on the semiconductor substrate; and
   an interconnect formed in at least one of the dielectric layers, the interconnect electrically connecting at least two of the conductive layers or one of the conductive layers and an active region in the semiconductor substrate, the interconnect comprising:
   a copper alloy seed layer formed along the bottom and sidewalls of the interconnect,
   a lower portion comprising substantially pure copper formed over the seed layer, the copper alloy seed layer surrounding the substantially pure copper in the lower portion and impeding electromigration of the substantially pure copper, and
   an upper portion comprising doped copper, the doped copper including 7% to about 12% by weight of a dopant element, wherein the upper portion has increased electromigration resistance as compared to the lower portion of the interconnect.

9. The semiconductor device of claim 8, wherein the dopant element in the upper portion comprises at least one of zirconium, strontium, palladium, magnesium, chromium, and tantalum.

10. The semiconductor device of claim 8, wherein the copper alloy seed layer includes about 0.3% to about 12% by weight of a dopant element, the dopant element comprising at least one of tin, zirconium, strontium, palladium, magnesium, chromium, and tantalum.

11. The semiconductor device of claim 8, wherein the interconnect represents at least one of a contact, a via and an interconnect line.

12. The semiconductor device of claim 8, wherein the lower portion comprises about 40% to about 90% of the interconnect.

13. The semiconductor device of claim 8, wherein the doped copper covers a substantial portion of an upper surface of the interconnect and exhibits increased electromigration resistance as compared to the lower portion of the interconnect.

14. The semiconductor device of claim 8, wherein the upper portion comprising doped copper includes at least 9% by weight of a dopant element.

15. The semiconductor device of claim 8, wherein the copper alloy seed layer includes at least 9% by weight of a dopant element.

16. A semiconductor device, comprising:
   a semiconductor substrate;
   a plurality of levels of dielectric layers and conductive layers formed on the semiconductor substrate; and an interconnect formed in at least one of the dielectric layers, the interconnect electrically connecting at least two of the conductive layers or one of the conductive layers and an active region in the semiconductor substrate, the interconnect comprising:
- a lower portion comprising substantially pure copper, the lower portion comprising about 40% to about 90% of the interconnect, and
- an upper portion formed directly on the substantially pure copper lower portion, the upper portion including 7% to about 12% by weight of a dopant element, wherein the upper portion has increased electromigration resistance as compared to the lower portion of the interconnect.

17. The semiconductor device of claim 16, wherein the dopant element comprises at least one of zirconium, strontium, palladium, magnesium, chromium, and tantalum.

18. The semiconductor device of claim 16, further comprising:
- a layer of doped copper formed along the bottom and sidewalls of the interconnect, the doped copper encapsulating the substantially pure copper in the lower portion of the interconnect.

19. The semiconductor device of claim 18, wherein the layer of doped copper comprises at least one of tin, zirconium, strontium, palladium, magnesium, chromium, and tantalum.

20. The semiconductor device of claim 16, wherein the interconnect represents at least one of a contact, a via and an interconnect line.

21. The semiconductor device of claim 16, wherein the doped copper covers a substantial portion of an upper surface of the interconnect.

22. The semiconductor device of claim 16, wherein the upper portion includes at least about 10% by weight of a dopant element.

23. The semiconductor device of claim 16, further comprising:
- a layer of doped copper formed along the bottom and sidewalls of the interconnect, the layer of doped copper including at least about 10% by weight of a dopant element.

* * * * *